United States Patent
Stich et al.

(10) Patent No.: US 11,585,884 B2
(45) Date of Patent: Feb. 21, 2023

(54) CONTINUAL TRAJECTORY CORRECTION IN MAGNETIC RESONANCE IMAGING

(71) Applicant: Siemens Healthcare GmbH, Erlangen (DE)

(72) Inventors: Manuel Stich, Parkstein (DE); Dominik Paul, Bubenreuth (DE); Mario Zeller, Erlangen (DE); Nadine Dispenza, Erlangen (DE)

(73) Assignee: Siemens Healthcare GmbH, Erlangen (DE)

( * ) Notice: Subject to any disclaimer, the term of this patent is extended or adjusted under 35 U.S.C. 154(b) by 0 days.

(21) Appl. No.: 17/393,521

(22) Filed: Aug. 4, 2021

(65) Prior Publication Data
US 2022/0043092 A1   Feb. 10, 2022

(30) Foreign Application Priority Data

Aug. 4, 2020  (DE) ...................... 10 2020 209 787.9

(51) Int. Cl.
*G01R 33/565* (2006.01)
*G01R 33/48* (2006.01)
*G01R 33/56* (2006.01)

(52) U.S. Cl.
CPC ... *G01R 33/56572* (2013.01); *G01R 33/4824* (2013.01); *G01R 33/5608* (2013.01)

(58) Field of Classification Search
CPC ............ G01R 33/4824; G01R 33/5608; G01R 33/56572
See application file for complete search history.

(56) References Cited

U.S. PATENT DOCUMENTS

| | | | |
|---|---|---|---|
| 2017/0192068 A1* | 7/2017 | Taniguchi | G01R 33/3854 |
| 2018/0136298 A1 | 5/2018 | Wilm et al. | |
| 2019/0377044 A1* | 12/2019 | Rahmer | G01R 33/5611 |
| 2020/0333410 A1 | 10/2020 | Ruyters et al. | |

OTHER PUBLICATIONS

Campbell-Washburn, Adrienne E., et al. "Real-time distortion correction of spiral and echo planar images using the gradient system impulse response function." Magnetic resonance in medicine 75.6 (2016): 2278-2285.
Clayton, David B., et al. "1H spectroscopy without solvent suppression: characterization of signal modulations at short echo times." Journal of Magnetic Resonance 153.2 (2001): 203-209.

(Continued)

*Primary Examiner* — Gregory H Curran
(74) *Attorney, Agent, or Firm* — Lempia Summerfield Katz LLC

(57) ABSTRACT

A correction method for reducing temperature-related deviations in a gradient response of an MR pulse sequence in MR imaging is provided. An MR pulse sequence that includes at least one nominal test gradient is run. A gradient response to the at least one nominal test gradient is repeatedly acquired by a magnetic field measurement in an examination region. A gradient system transfer function is determined based on the gradient response. A corrected MR pulse sequence is determined based on the gradient system transfer function and of the at least one nominal test gradient.

15 Claims, 10 Drawing Sheets

(56) References Cited

OTHER PUBLICATIONS

De Zanche, Nicola, et al. "NMR probes for measuring magnetic fields and field dynamics in MR systems." Magnetic Resonance in Medicine: An Official Journal of the International Society for Magnetic Resonance in Medicine 60.1 (2008): 176-186.

Duyn, Jeff H., et al. "Simple correction method for k-space trajectory deviations in MRI" Journal of Magnetic Resonance 132.1 (1998): 150-153.

Foerster, Bernd U., Dardo Tomasi, and Elisabeth C. Caparelli. "Magnetic field shift due to mechanical vibration in functional magnetic resonance imaging." Magnetic Resonance in Medicine: An Official Journal of the International Society for Magnetic Resonance in Medicine 54.5 (2005): 1261-1267.

Jehenson, P., M. Westphal, and N. Schuff "Analytical method for the compensation of eddy-current effects induced by pulsed magnetic field gradients in NMR systems." Journal of Magnetic Resonance (1969) 90.2 (1990): 264-278.

Mazurkewitz, Peter, Jürgen Rahmer, and Peter Börnert. "GIRF measurement using a combination of triangular and chirp waveform input functions." Proceedings of the 26th Annual Meeting of ISMRM, Paris, France. 2018. p. 0169.

Peters, Dana C., et al. "Undersampled projection reconstruction applied to MR angiography" Magnetic Resonance in Medicine: An Official Journal of the International Society for Magnetic Resonance in Medicine 43.1 (2000): 91-101.

Stich, Manuel, et al. "Gradient waveform pre-emphasis based on the gradient system transfer function." Magnetic resonance in medicine 80.4 (2018): 1521-1532.

Stich, Manuel, et al. "The temperature dependence of gradient system response characteristics." Magnetic resonance in medicine 83.4 (2020): 1519-1527.

Vannesjo, S. Johanna, et al. "Image reconstruction using a gradient impulse response model for trajectory prediction." Magnetic resonance in medicine 76.1 (2016): 45-58.

Vannesjo, Signe J., et al. "Gradient system characterization by impulse response measurements with a dynamic field camera." Magnetic resonance in medicine 69.2 (2013): 583-593.

Wech, Tobias, et al. "Using self-consistency for an iterative trajectory adjustment (SCITA)" Magnetic resonance in medicine 73.3 (2015): 1151-1157.

Wu, Yuhua, et al. "Gradient-induced acoustic and magnetic field fluctuations in a 4T whole-body MR imager" Magnetic resonance in medicine 44.4 (2000): 532-536.

German Office Action for German Application No. 10 2020 209 787.9 dated May 4, 2021.

* cited by examiner

CONTINUAL TRAJECTORY CORRECTION IN MAGNETIC RESONANCE IMAGING

This application claims the benefit of German Patent Application Number DE 102020 209787.9, filed on Aug. 4, 2020, which is hereby incorporated by reference in its entirety.

BACKGROUND

The present embodiments relate to a correction method for reducing temperature-related deviations in a gradient response of a magnetic resonance (MR) pulse sequence in MR imaging. The present embodiments also relate to a method for recording magnetic resonance image data relating to an examination object. The present embodiments further relate to a correction facility. The present embodiments further relate to an MR image reconstruction facility and a magnetic resonance installation.

In a magnetic resonance system, with the aid of a main magnetic field system, the body to be examined is usually exposed to a relatively high main magnetic field of, for example, 1.5 tesla, 3 tesla or 7 tesla. After the main field has been applied, nuclei are aligned in the examination object along the field with a nuclear magnetic dipole moment that is not insignificant, frequently referred to as a spin. This collective property of the spin system is described as macroscopic "magnetization". Macroscopic magnetization is the vector sum of all the microscopic magnetic moments in the object at a specific location. In addition to the main field, with the aid of a gradient system, a magnetic field gradient, by which the magnetic resonance frequency (Larmor frequency) at the location in question is determined, is applied. Using a radiofrequency transmission system, radiofrequency excitation signals (RF-pulses) are then emitted using appropriate antenna facilities, which is intended to lead to the nuclear spins of certain nuclei that have been resonantly excited by this radio frequency field (e.g., at the Larmor frequency prevalent at the respective location) being tilted by a defined flip angle with respect to the magnetic field lines of the main magnetic field. If such an RF pulse acts on spins that have already been excited, these may then be tilted into a different angular position or even folded back into an initial state parallel with the main magnetic field. During the relaxation of the nuclear spins that have been excited, radiofrequency signals (e.g., magnetic resonance signals) are resonantly emitted. These signals are received by appropriate receive antennas (also known as magnetic resonance coils or receive coils), subsequently demodulated and digitalized, and then further processed as "raw data". The acquisition of the magnetic resonance signals ensues in the local frequency space (e.g., the "k-space"). During a measurement (e.g., of a slice), k-space is traversed temporarily along a "gradient trajectory" defined by the application of the gradient pulses (also known as a "k-space trajectory"). The RF pulses are to be emitted in a suitably time-coordinated manner. From the raw data thus acquired, after further processing steps, which usually depend on the method of acquisition, the desired image data may finally be reconstructed by a two-dimensional Fourier transform. Alternatively, three-dimensional volumes may also be excited in a defined manner and read out, with the raw data being sorted in turn after further processing steps into a three-dimensional k-space. Then, a reconstruction of a three-dimensional image data volume may ensue by a three-dimensional Fourier transform.

Usually, when activating a magnetic resonance tomography system, specific predetermined pulse sequences are used in the measurement process (e.g., sequences of defined RF pulses and of gradient pulses in various directions and of readout windows during which the receive antennas are set on receive and the magnetic resonance signals are received and processed).

The gradient pulses are defined by corresponding gradient amplitudes, the gradient pulse duration, and by the slope steepness or the first derivation of the pulse shape dG/dt of the gradient pulses (also known as the "slew rate"). Since the hardware has a maximum load limit, the gradient strength, and the rise in the gradient (e.g., the "slew rate"), are basically limited.

With the aid of a measurement protocol, the aforementioned pulse sequences for a desired examination (e.g., a specific contrast of the calculated images) may be parameterized in advance. The measurement protocol may also contain further control data for the measurement process. There are a number of magnetic resonance sequencing techniques according to which pulse sequences may be constructed and with which magnetic resonance recordings may be generated.

"Magnetic resonance recordings" are to be understood hereafter as image data relating to the inside of the examination object, generated with the aid of a magnetic resonance unit that has been activated in the context of the method, but also as parameter maps that reproduce a spatial or temporal distribution of specific parameter values within the examination object and, for example, may be generated from the image data. "Recording" of magnetic resonance image data is understood as the carrying out of an image acquisition method with the aid of a magnetic resonance imaging system.

As already mentioned, in magnetic resonance imaging, there is not any direct image recording in the spatial domain, but magnetic resonance signals are first measured, the amplitude of which is interpreted as a Fourier transform of the image recording in k-space. Here, k-space may be understood as the spatial frequency domain of the density distribution of the magnetic moments in a region to be examined in which MR signals are acquired. If k-space is sampled adequately, the spatial distribution of the density of the magnetic moments is obtained through a Fourier transform (e.g., which is two-dimensional in the case of scanning on a slice-by-slice basis). In the course of the measurement, this k-space is filled with raw data that corresponds with the magnetic resonance signals that have been captured. The lines are conventionally sampled on a Cartesian grid of k-space. This usually has the advantage that any potential shifts in the measured lines are the same for each k-space line. This coherent shift results in a phase shift in the image data. Since only the magnitudes of the image signals are taken into account in most image recordings, this phase shift no longer appears in the representation in the spatial domain. This type of k-space sampling is therefore very robust.

However, k-space may also be filled with raw data, using other sampling patterns, so-called trajectories. For example, sampling of k-space may ensue using a radial or spiral-shaped trajectory. These sampling patterns each have specific advantages and disadvantages. For example, radial sampling is particularly robust against motion artifacts and against under-sampling.

In magnetic resonance imaging, the accuracy in the application of the gradients by the gradient system may have a considerable effect on the image quality. As has just been mentioned, pulse sequences with radial or spiral-shaped trajectories are used alongside imaging sequences with Cartesian trajectories of the gradients, and in addition to this, single shot EPI sequences are used for MR imaging. The latter sequences are more exacting in terms of the chronological accuracy of the gradient fields. The causes of deviations in the gradients actually applied from the intended gradient trajectories include the occurrence of eddy currents, tuning and amplifying errors and field fluctuations that are caused by mechanical vibrations following the changing of gradients and by thermal variation in hardware components. All these effects lead to the creation of a gradient shape that deviates from the nominal gradient shape (e.g., from the shape of the gradient that was actually intended). This deviation leads to errors in the determination of the k-space-trajectory that is required for the reconstruction of image data, errors in the acquired signal, and artifacts in the images.

FIG. 1 shows a comparison between the nominal gradient, as designed in the pulse program, and the actual gradient that is then applied by the MR scanner. The deviations between the nominal input and the actual output may be explained by hardware inaccuracies.

If the deviations are known precisely, then an actual k-space-trajectory may be determined and used for the image reconstruction. Alternatively, the actual k-space-trajectory may also be measured. In addition, studies have shown that the properties of the gradient system are temperature-dependent. FIG. 2 shows the temperature profile or the temperature curve during an MR image recording, which influences the transmission properties of the dynamic gradient system during the daily clinical routine. Temperature sensors that are arranged to monitor the temperature on the cable connections and on the gradient systems show temperatures that may rise from 18° C. up to 55°. As a result of the temperature-dependent change in the frequency transmission characteristics, the gradient correction method is to be adjusted in order to optimally reduce gradient system inaccuracies. FIG. 3 shows deviations in the frequency-dependent gradient system transfer function (GSTF) between a temperature of 20° C. and a temperature of 40° C.

As yet, the problem of changing gradient system characteristics due to gradient heating has not been solved.

Traditionally, a correction ensues only of gradients for a specific gradient system state at only one temperature. For example, a gradient characterization function is determined once for the room temperature and is then used for the entire imaging sequence, without taking into account a temperature change during imaging.

The single static gradient correction is based on a technique that uses a gradient characterization function (e.g., gradient impulse response function (GIRF) or gradient system transfer function (GSTF)) in order to correct hardware deviations. Here $$GSTF(f) = F\{GIRF(t)\}. \tag{1}$$

F is the Fourier transform, f the frequency and t the time.

In this technique, linear and time-invariable characteristics of the dynamic gradient system are used during image reconstruction to correct gradients that have been applied by a scanner system. In one technique, an impulse response function (e.g., gradient impulse response function (GIRF)) or Transfer Function (e.g., gradient system transfer function (GSTF)) of the system is used to correct non-Cartesian trajectories. The gradient system transfer function is an approach for characterizing the properties of a dynamic gradient system. FIG. 4 shows the magnitude and the phase response of a GSTF term of the first order.

In a post-correction, the corrected gradients $g_{post,l}(t)$ for each axis (l=x, y, z) are calculated by multiplying the Fourier transform of the nominal gradient $G_{nom,l}(f)$ by the relevant GSTFs at the correct temperature state $GSTF_{l,l}(f)$ and by a Fourier transform in the time domain (back transformation):

$$g_{post,l}(t) = F^{-1}\{F\{g_{nom,l}(t)\} \cdot GSTF_{l,l}(f)\} \tag{2}$$

The value l represents the direction x, y, or z, into which the input gradient $g_{nom,l}(t)$, also known as the nominal gradient, has been applied and in which the output gradient $G_{real,l}(f)$ is measured.

In a preliminary equalization, the inverse GIRF or GSTF is used to achieve a corrected nominal gradient shape $g_{pre,l}(t)$, such that the desired output gradient $G_{real,l}(t)$, which corresponds with the unaltered nominal gradient $g_{nom,l}$, is obtained:

$$g_{pre,l}(t) = F^{-1}\{F\{g_{nom,l}(t)\} \cdot GSTF_{l,l}^{-1}(f)\} \tag{3}$$

Equations 2 and 3 show simplified corrections of the gradients, with only the self-terms of the first order of the GSTF being used. By way of explanation, it is worth briefly mentioning here that the GSTF also includes terms that describe the interactions between magnetic field components from different directions as well as terms of a higher order. In order to carry out a comprehensive and complete correction of all the magnetic field components, all the GSTF terms from the zero order to the $n^{th}$ order have to be used. However, an adequate correction may already be achieved by using mainly the terms of the zero order to correct the Bo fields and the terms of the first order to correct the gradient fields.

Equivalent to equation 2 is a folding of the gradient with a kernel $GIRF_{l,l}(t)$, the inverse of the GSTF. Here $$GIRF \times GIRF^{-1} = \delta \tag{4}$$

In equation 4, the operator "×" is a folding operator.

To determine the GSTF, the gradient system is to be tested using a broad frequency spectrum. Ideally, a Dirac impulse $\delta(t)$ would be suitable as a test gradient function in order to achieve coverage of all the frequencies. The gradients that are applied by the scanner are measured in small dynamic field samples with which a phase development or a phase signal may be determined. The phase signal is based on the raw signal (e.g., on the signal that is measured by the coils). Only the phase of the signal, also referred to as the FID, is further processed, but the magnitude is not taken into account. The gradient may be determined from the phase signal. A formula for this may be found, for example, in https://online-library.wiley.com/doi/abs/10.1002/mrm.27147.

FIG. 5 shows the determination of the GSTF using 12 different triangular-shaped gradient pulses.

Overall, it may be established that the correction of gradient fields is already known, although the correction is restricted to constantly compensating for interference effects that occur during the course of a magnetic resonance recording. The dynamic properties of the entire system involved in magnetic resonance imaging during the process of imaging and the influence thereof on the gradient fields have not been taken into account as yet.

SUMMARY AND DESCRIPTION

The scope of the present invention is defined solely by the appended claims and is not affected to any degree by the statements within this summary.

The present embodiments may obviate one or more of the drawbacks or limitations in the related art. For example, an improved method for correcting gradient-related distortions in magnetic resonance (MR) imaging is provided.

In the correction method according to the present embodiments for reducing temperature-related deviations in a gradient response of an MR pulse sequence in MR imaging, an MR pulse sequence that includes at least one nominal test gradient is applied. The test gradient may include any gradient in the pulse sequence. For example, the test gradient may include an imaging gradient or a diffusion gradient. The test gradient may therefore have a dual function: that of a test function; and that of a regular function in a pulse sequence. An imaging gradient serves, for example, for locating the effect of an RF pulse. However, the test gradient may also include a gradient exclusively for test purposes (e.g., for the case where the other gradients are not suitable for test purposes). The application of the MR pulse sequence ensues in the context of a magnetic resonance imaging process. A "nominal test gradient" may be the nominal field strength values assigned to a test gradient that are to be expected when a gradient is applied. Due to dynamic disruptive influences, these are not yet the real field strength values for the test gradient, which are to be determined by a corresponding measurement of the test gradient or of the field strength thereof. Further, a gradient response to the at least one nominal test gradient is repeatedly acquired at certain time intervals using a magnetic field measurement in an examination region during the process of magnetic resonance imaging. The gradient response is the actual field strength that has already been mentioned, which is generated by the test gradient. Further, a gradient characterization function is determined based on the gradient response. Such a gradient characterization function describes a mathematical connection between a nominal test gradient and the gradient response. The gradient characterization function may include, for example, the gradient system transfer function or the gradient impulse response function already mentioned in the introduction. Finally, a corrected MR pulse sequence is determined based on the gradient characterization function and the at least one nominal test gradient. Since the testing process is incorporated in the actual magnetic resonance imaging process and therefore runs simultaneously with the magnetic resonance imaging, temperature variations and the influence thereof on the actual sampling trajectory in k-space may be taken into account in the process of image recording and/or image reconstruction, such that artifacts due to changes occurring in the short term during imaging may be compensated for in the system as a whole. For example, temperature variations (e.g., variations in the gradients and artifacts due to temperature variations and resulting therefrom) may be suppressed or at least reduced. For example, temperature variations that are generated by the operation of the MR system itself may quickly lead to changeable interference effects that may only be detected and compensated for by prompt monitoring, as is achieved according to the present embodiments.

In the method according to the present embodiments for recording magnetic resonance image data relating to an examination object, raw data generated by a gradient pulse sequence are acquired. Then, a corrected gradient pulse sequence is determined based on the correction method according to the present embodiments. MR image data is reconstructed based on the raw data acquired and the corrected gradient pulse sequence. In one embodiment, the image reconstruction may ensue based on gradient field data monitored in real time, such that artifacts due to fast-changing disruptive influences on the gradient fields may be suppressed.

The correction facility according to the present embodiments has an output interface for running an MR pulse sequence that includes at least one nominal test gradient. The correction facility additionally includes an input interface for the repeated acquisition of a gradient response to the at least one nominal test gradient by a magnetic field measurement in an examination region. In addition, the correction facility according to the present embodiments includes a determination unit for determining a gradient characterization function based on the gradient response and a correction unit for determining a corrected MR pulse sequence based on the gradient characterization function and the at least one nominal test gradient. The correction facility according to the present embodiments shares the advantages of the correction method according to the present embodiments for reducing temperature-related deviations in a gradient response in an MR pulse sequence in MR imaging.

The MR image reconstruction facility according to the present embodiments includes the correction facility according to the present embodiments, an input interface for acquiring MR raw data relating to an examination region, and an image reconstruction unit for reconstructing the acquired raw data based on an MR pulse sequence corrected by the correction facility. The MR image reconstruction facility according to the present embodiments shares the advantages of the correction method according to the present embodiments for reducing temperature-related deviations in a gradient response of an MR pulse sequence in MR imaging.

Alongside a main field magnet system, with which a main magnetic field is applied in the usual manner in the patient measurement space, the magnetic resonance installation according to the present embodiments is to include a control facility for activating the main field magnet system, a transmission antenna system with a radiofrequency transmission facility, a gradient system that includes a plurality of gradient coils with a gradient system interface, a receive antenna system with a radiofrequency receive facility, and an image correction facility according to the present embodiments. The magnetic resonance installation according to the present embodiments shares the advantages of the correction method according to the present embodiments for reducing temperature-related deviations in a gradient response of an MR pulse sequence in MR imaging.

The correction facility according to the present embodiments may be implemented in the form of software on a suitable programmable control facility of a magnetic resonance installation with corresponding memory options. The radiofrequency transmission facility, the gradient system interface, and the radiofrequency receive facility may be at least partly implemented in the form of software units, where other units of these components are purely hardware units (e.g., a radio frequency amplifier, a radio frequency transmission facility, a gradient pulse-generating facility in the gradient system interface or an analog-/digital transformer in the radio frequency receive facility, and so on). An extensively software-based implementation (e.g., of the aforementioned units) has the advantage that even magnetic resonance installation control facilities used hitherto may be upgraded in a simple manner by a software update in order to work in the manner according to the present embodiments. To this extent, the problem is also solved by a computer program product that is stored in a transportable memory and/or is made available for transmission via a network and may therefore be loaded directly into a memory of a programmable magnetic resonance installation control facility, with program segments to carry out all the acts in the correction method according to the present embodiments for reducing temperature-related deviations in a gradient response of an MR pulse sequence in MR imaging and/or all the acts in the method according to the present embodiments for recording magnetic resonance image data relating to an examination object when the program is run in the control facility.

Alongside the computer program, such a computer program product may optionally include additional components, such as, for example, documentation and/or additional components, and also hardware components, such as hardware keys (e.g., dongles etc.) for using the software.

For transporting the control facility and/or storage on or in the control facility, it is possible to use a computer-readable medium, such as a memory stick, a hard disk, or other transportable or fixedly installed data carrier, on which the program segments of the computer program that may be read out and executed by a computation unit of the control facility are stored. The computation unit may include, for this purpose, one or a plurality of microprocessors or suchlike working in combination.

It is being possible, for example, for one category of the present embodiments to be developed by analogy with another category of the present embodiments. In addition, in the context of the present embodiments, the various features of different exemplary embodiments may be combined to form new exemplary embodiments.

In the correction method according to the present embodiments, the repeated acquisition of a gradient response may ensue at least after every fifth repetition interval. Experiments have shown that relevant temperature changes may occur in magnetic resonance imaging after about five repetition intervals. It is therefore sufficient to apply a test gradient at every fifth repetition interval. If the frequency of gradient application is reduced to a minimum level, the duration of the magnetic resonance imaging process may optionally be reduced to a minimum. Moreover, the computation effort for the corrections is limited to what is necessary.

In one embodiment, in the correction method, the repeated acquisition of a gradient response ensues in each repetition interval. In this variant, it is also possible to compensate for interference effects that occur with an unexpected speed and which impact on the gradient fields.

In the correction method according to the present embodiments, the nominal test gradient may have the shape of a rectangle or a trapezium. Test gradients configured in such a way cover a broad frequency spectrum and are therefore suitable for the correction of trajectories in the entire k-space.

In the correction method according to the present embodiments, the gradient pulse sequence may include the nominal test gradient as an integral component. In one embodiment, no additional test gradients have to be built into the gradient pulse sequence. In other words, the test gradient has a dual function; the test gradient is both a test gradient and the gradient defining the sampling trajectory of the pulse sequence. Depending on the type of MR pulse sequence used, such gradients with a dual function may include, for example, rephasing gradients, slice selection gradients, diffusion gradients, read-out gradients, phase-encoding gradients, and so on.

Further, in the correction method according to the present embodiments, the gradient pulse sequence may include the nominal test gradient as an additional gradient pulse. This additional gradient pulse is advantageous, for example, for a case where, in the correction method according to the present embodiments, the gradient pulse sequence does not include any rectangular- or trapezoid-shaped gradient pulses. In such a case, often not all the frequencies necessary for sampling or obtaining the raw data are covered by the gradient pulses that are already present in the pulse sequence. In order to obtain as precise as possible a correction of the gradient fields despite this, an additional gradient pulse may be transmitted within a repetition interval. This nominal test gradient may also have a shape that deviates from a rectangle or a trapezoid.

The nominal test gradient may, for example, include at least one chirp pulse, such that the gradient response of the chirp pulse is acquired to determine the gradient system transfer function. Such a chirp pulse is advantageous, for example, in all MR pulse sequences in which no trapezoid gradients or rectangular-shaped gradients occur. The chirp pulse has the advantage that the chirp pulse has a very short pulse duration. A trapezoid gradient also takes a bit longer in order to bring the trapezoid gradient to the required amplitude.

Likewise, in the correction method according to the present embodiments, the gradient pulse sequence includes at least one spiral-shaped gradient. A spiral-shaped gradient does not cover all the frequencies occurring in k-space, but this deficit may be compensated for by an additional test gradient pulse (e.g., a chirp pulse or a trapezoid- or rectangular-shaped pulse). A chirp pulse requires particularly little time, such that the chirp pulse fits into a repetition interval. This does not increase the measurement time, and the gradient fields may be corrected in real time.

In the correction method according to the present embodiments, an already applied gradient from the gradient pulse sequence may be corrected based on the gradient characterization function and the at least one nominal test gradient in a repetition interval. Such a retroactive correction, also known as a "post-correction, allows a particularly precise correction of the gradient fields since a test gradient may be used to correct the respective repetition interval in which it also occurs.

In the correction method according to the present embodiments, a corrected gradient from the gradient pulse sequence of a subsequent repetition interval may be determined in advance based on the gradient characterization function and at least one nominal test gradient in a repetition interval. This procedure is also known as "pre-emphasis". In one embodiment, in this variant, a correction may already be carried out when applying the gradients, such that the actual image reconstruction no longer requires any corrections of the gradient fields. This variant has the special feature that the gradient characterization function that has been determined may only be applied to the repetition interval that follows and cannot already be applied to the repetition interval in which the nominal test gradient is located. With the usual temperature variations, this minimal delay is not expected to have any relevant effect, however.

The gradient characterization function (e.g., a gradient impulse response function) may be determined, for example, by an MR test recording with the aid of a phantom. The determination of the gradient characterization function with the aid of a phantom requires less logistics effort and is less expensive than the procedure with a field camera.

Alternatively, a measurement of the gradient may also ensue with the aid of a field camera. However, this procedure is more complex and also takes a longer time than the aforementioned procedure. Moreover, the direct measurement is to be carried out again when there is a change in the measurement parameters.

DETAILED DESCRIPTION

Figure 1:
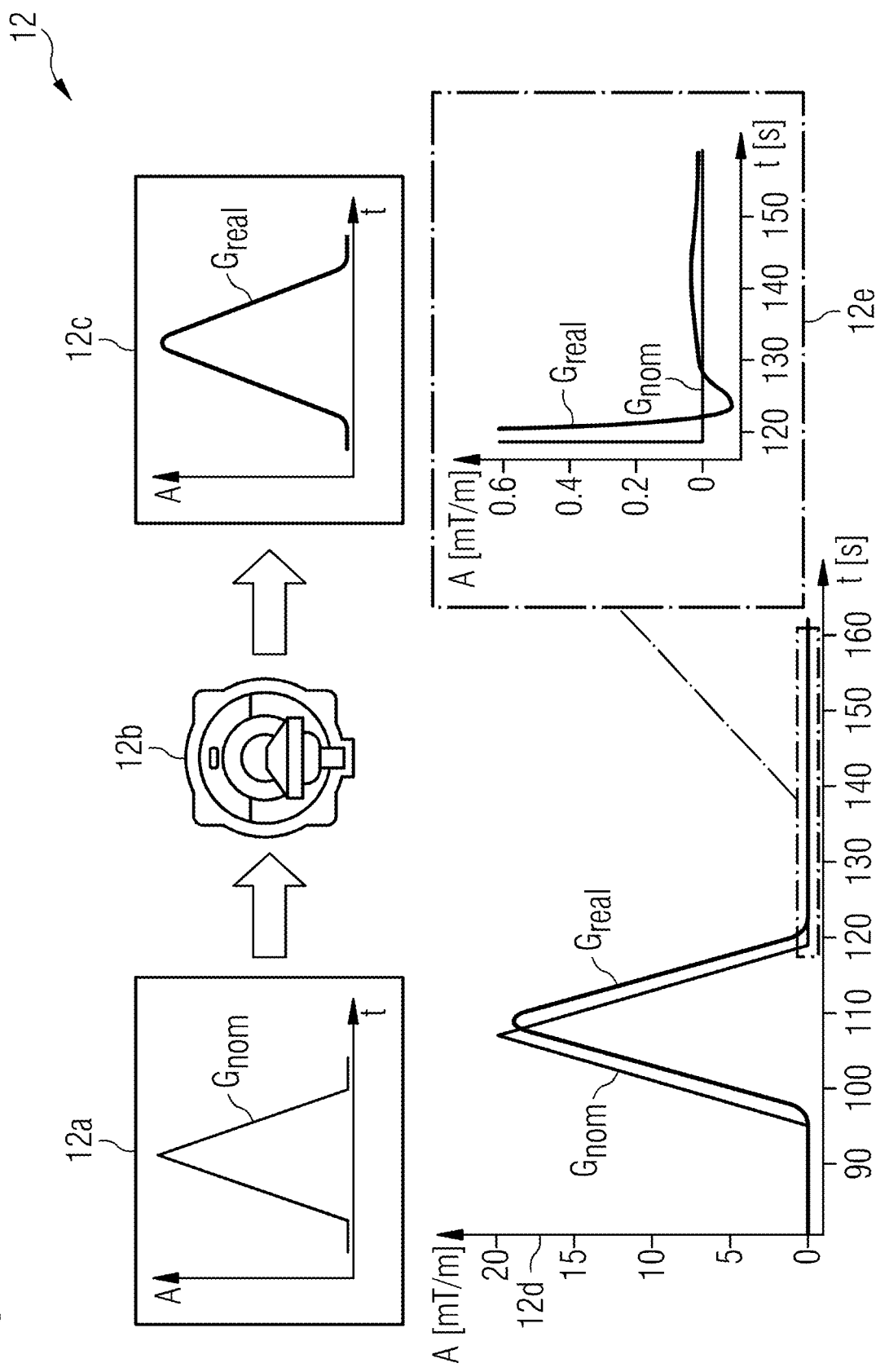
FIG. 1 is a comparative representation of nominal gradients and of gradients that have actually been applied in a pulse sequence in magnetic resonance (MR) imaging.

FIG. 1 shows a comparative view of nominal gradients $G_{nom}$ and the gradients actually applied $G_{real}$ in a pulse sequence in MR imaging. The nominal gradients $G_{nom}$ have field strength values set by a control unit of the MR system, whereas the real gradients $G_{real}$ correspond with field strength values actually measured in an examination region. A sub-view 12a top left shows a diagram of an input gradient or nominal gradient $G_{nom}$ that is generated by a control facility in an MR system and is transferred to a scanner 12b in the MR system. The input gradient or nominal gradient $G_{nom}$ is shown in a sub-section in the top center. The gradient $G_{real}$ actually applied by the scanner 12b is shown in a sub-view 12c top right. In the example shown in FIG. 1, the nominal gradient $G_{nom}$ has a triangular shape. Such a triangular shape covers a relatively broad frequency range and may therefore provide a really good illustration of the response properties of a gradient in the frequency space. The real gradient $G_{real}$ has a gradient shape that differs from the nominal gradient $G_{nom}$, due to the interference effects already mentioned, such as, for example, eddy currents, temporary tuning- and amplification errors, and field fluctuation due to mechanical vibrations after switching on a gradient and also to thermal changes in the hardware components. The real gradient $G_{real}$ is, for example, somewhat rounded compared with the angular nominal gradient $G_{nom}$.

In a lower partial diagram 12d, both gradients $G_{nom}$, and $G_{real}$ are shown together. As shown by the partial diagram 12e, the real gradient $G_{real}$ is somewhat staggered over time with respect to the nominal gradient $G_{nom}$.

A section of the partial diagram 12d is shown enlarged in a partial diagram 12e. In the partial diagram 12e, the real gradient $G_{real}$ or the amplitude of the real gradient $G_{real}$ at t=122 s drops below the nominal gradient $G_{nom}$ and at around t=130 s assumes a higher value of magnitude than the nominal gradient $G_{nom}$ in order to coincide with the nominal gradient again on the zero line at values of t=160 s.

Figure 2:
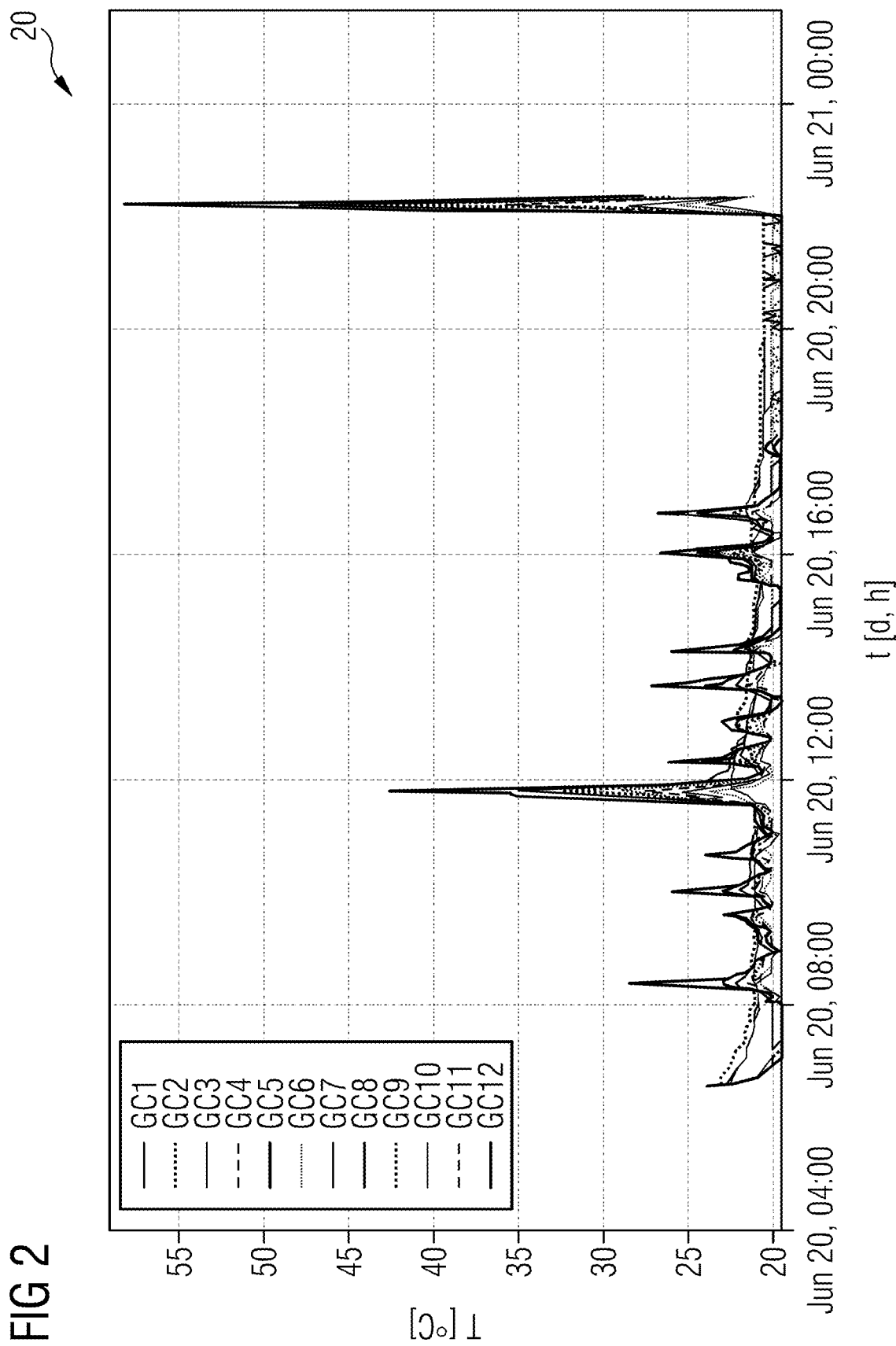
FIG. 2 is a diagram illustrating exemplary diurnal variation in a temperature in a region of an MR scanner.

FIG. 2 shows a diagram 20 illustrating the diurnal variation in a temperature of a total of twelve temperature measurement points GC1, . . . , GC12 in the range covered by an MR scanner. The temperature is therefore measured at different points in the range covered by the MR scanner and is recorded in degrees Centigrade over time in days d or hours h. The various temperature curves are measured at different measurement points on the MR scanner.

As shown from diagram 20, peak temperatures of up to 60° C. are recorded at times, and the temperature range extends from around 20° C. to 60° C. These temperature differences lead to different response characteristics of the entire system to applied gradients. However, since the trajectory that the gradients describe in k-space should be known as precisely as possible for the reconstruction in order to obtain a good image quality, it is desirable to know the temperature-related deviations in the real gradient $G_{real}$ from the nominal gradient $G_{nom}$ or optionally even to compensate for these.

Figure 3:
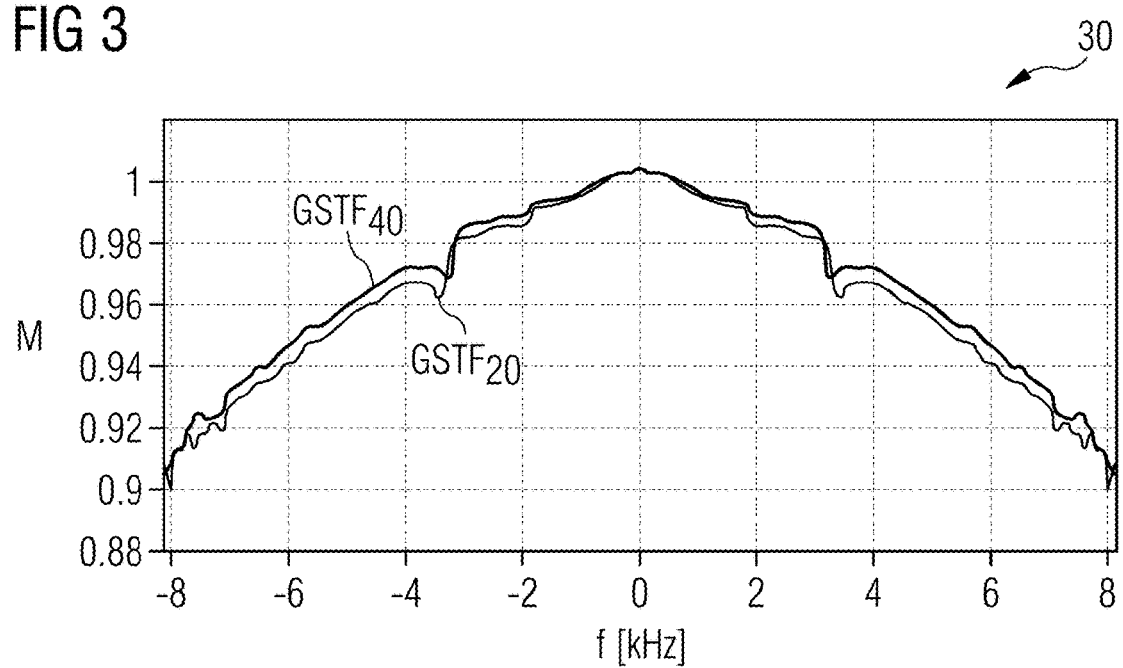
FIG. 3 is a diagram illustrating magnitude of an exemplary gradient system transfer function.

FIG. 3 shows a diagram illustrating a magnitude M of a gradient system transfer function GSTF. A gradient system transfer function GSTF is derived from the quotient of the gradient $G_{real}$ and the nominal gradient $G_{nom}$. FIG. 3 illustrates two gradient system transfer functions $GSTF_{20}$ and $GSTF_{40}$ for two different temperatures of 20° C. and 40° C. The diagram records values of magnitude M for $GSTF_{20}$ and $GSTF_{40}$ across the frequency f in kHz. As shown by the diagram 30, the magnitude M is somewhat higher at 40° C. than at 20° C.

Figure 4:
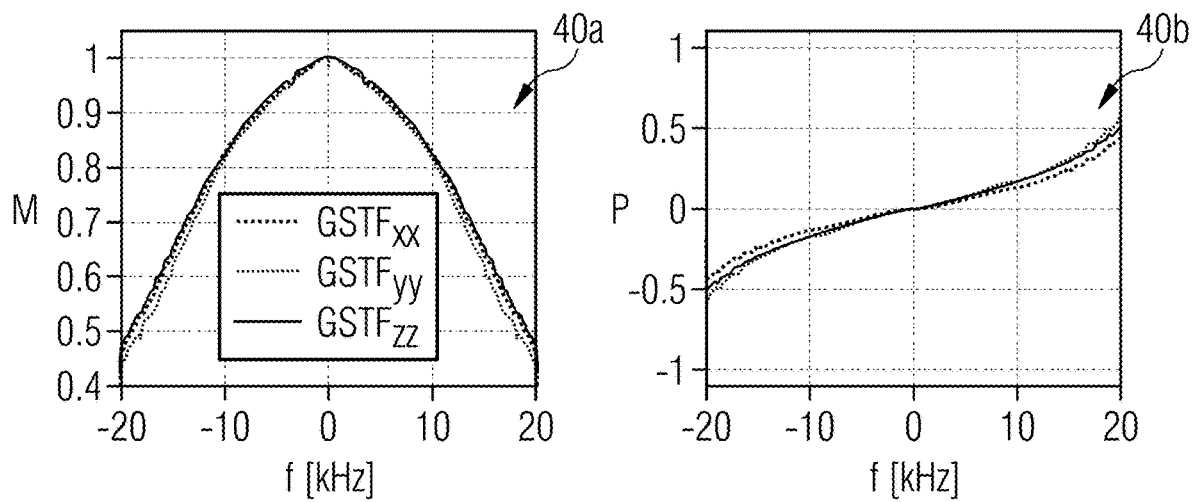
FIG. 4 is a diagram illustrating an exemplary magnitude response and an exemplary phase response of a gradient system transfer function of the first order.

FIG. 4 shows two diagrams 40a, and 40b, with a first diagram 40a showing the magnitude M of a gradient system transfer function GSTF and a second diagram 40b showing the phase P of the gradient system transfer function GSTF. In each case, three slightly different gradient system transfer functions $GSTF_{xx}$, $GSTF_{yy}$, $GSTF_{zz}$ are shown as diagonal components of matrix-type gradient system transfer functions GSTF.

Figure 5:
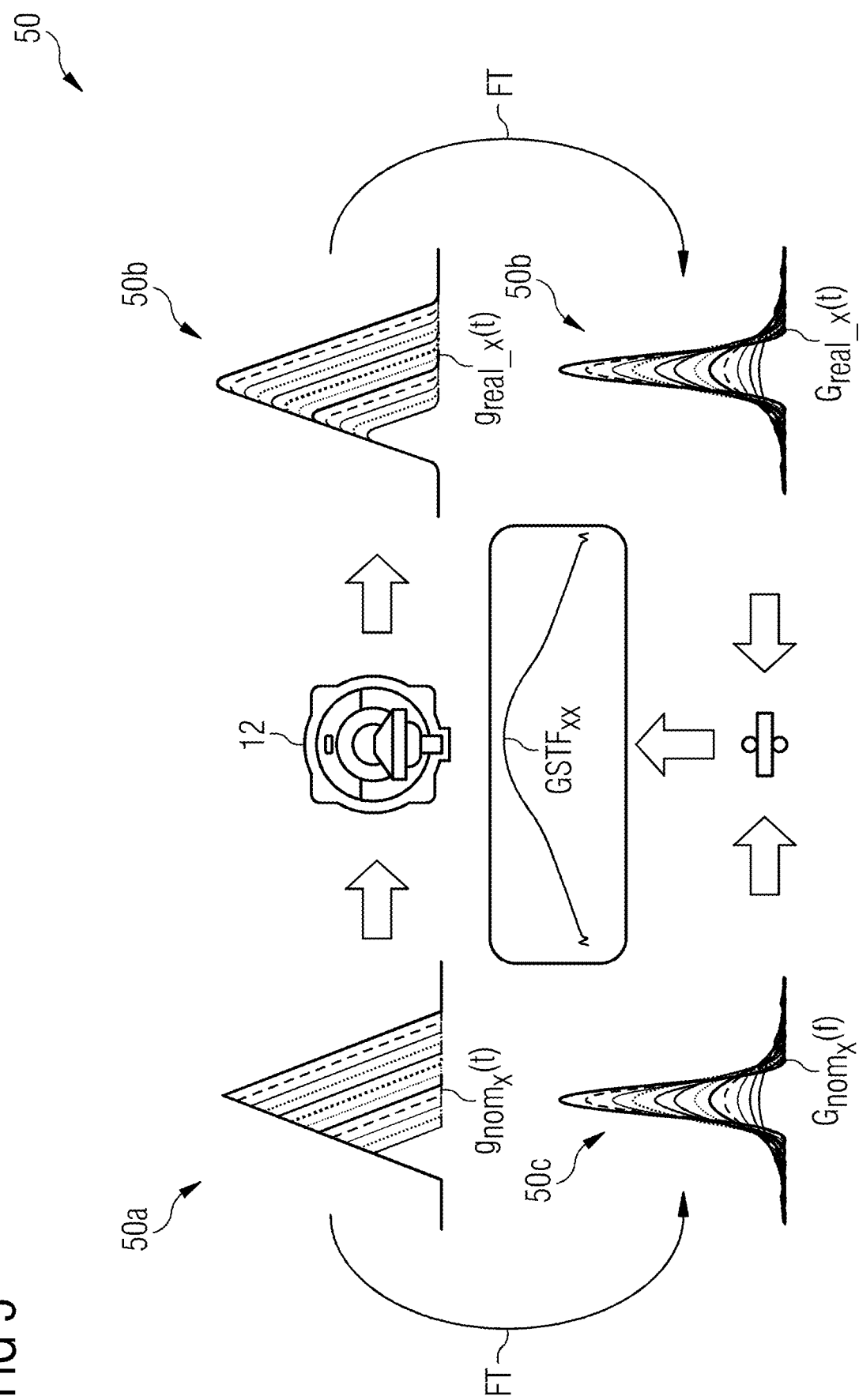
FIG. 5 is a diagram illustrating an exemplary transfer of a gradient system transfer function using twelve different triangular gradient pulses.

FIG. 5 shows a diagram 50 illustrating the determination of a gradient system transfer function $GSTF_{xx}$ for gradients in the x-direction, using a combination of twelve different triangular-shaped gradient test pulses $g_{nom\_x}(t)$. A first partial diagram 50a shows a set of 12 triangular-shaped gradient test pulses $g_{nom\_x}(t)$ with different line patterns (e.g., dashed, continuous, dotted). After these have been applied in an MR scanner 12, these are converted into real gradient pulses $g_{real\_x}(t)$, which are shown in a second diagram 50b. As shown in the second diagram 50b, the real gradient pulses $g_{real\_x}(t)$ g are slightly rounded, and some of the real gradient pulses $g_{real\_x}(t)$ also fall below the zero line as already discussed in FIG. 1. The two diagrams 50a, 50b are shown in the time domain. Further, diagrams 50c, 50d of the nominal gradients $G_{nom\_x}(f)$ and of the real gradients $G_{real\_x}(f)$ are also shown in the frequency range in the two diagrams 50c and 50d. The gradients $G_{nom\_x}(f)$, $G_{real\_x}(f)$ are derived in each case by a Fourier transform FT from the time domain into the frequency domain. The gradient system transfer function $GSTF_{xx}$, which is determined by dividing the real gradient $G_{nom\_x}(f)$ by the nominal gradient $G_{nom\_x}(f)$, is shown in the center of diagram 50. This situation is symbolized in FIG. 5 by a large division sign "÷".

Figure 6:
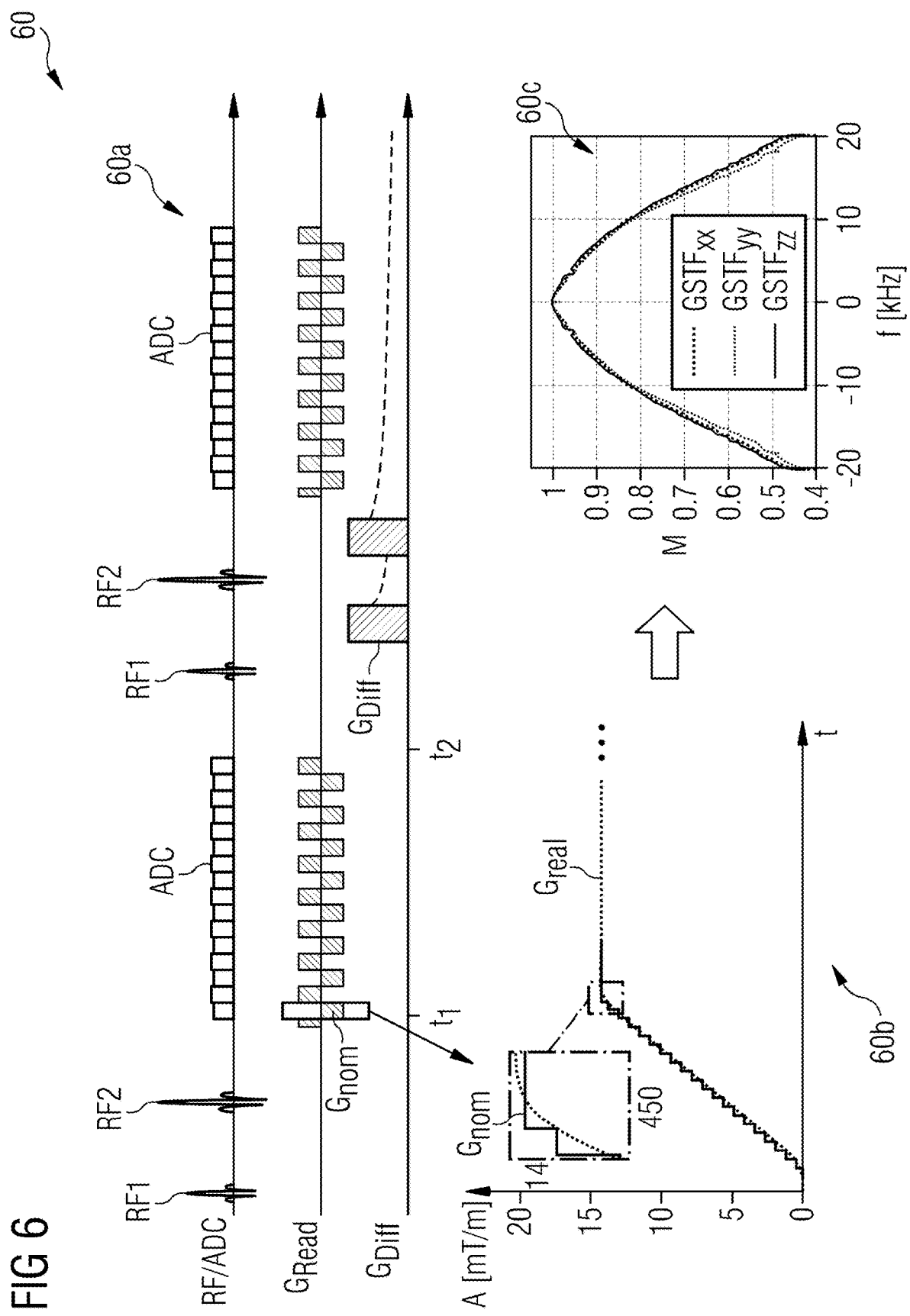
FIG. 6 is an exemplary pulse sequence diagram illustrating a EPI pulse sequence, a comparison of a nominally input rectangular gradient with a gradient that has actually been output and measured, and also the respective gradient system transfer function.

FIG. 6 shows a diagram 60 for an EPI sequence. An upper partial diagram 60a shows a pulse sequence diagram illustrating an EPI-pulse sequence. A second partial diagram 60b, bottom left, shows a comparison of the course over time of an amplitude A of a nominal rectangular-shaped gradient that has been input $G_{read}$ with the course over time of an amplitude A of a gradient $G_{real}$ that has actually been output and measured. A third partial diagram 60c, bottom right, shows the gradient system transfer function GSTF or three diagonal components $GSTF_{xx}$, $GSTF_{yy}$, $GSTF_{zz}$ or corresponding magnitude M as a function of the frequency f.

The top partial diagram in FIG. 660a show a pulse diagram for an echoplanar imaging procedure with diffusion weighting. In a first line, which is labelled RF/ADC, the pulse diagram includes an RF excitation pulse RF1 and an RF refocusing pulse RF2. Further, readout windows ADC, symbolized by boxes, are drawn in the first line. The pulse diagram shows two repetition intervals (e.g., the pulses applied are repeated once). In a second line of the pulse diagram, which is labelled as $G_{Read}$, a sequence of readout gradients $G_{Read}$ is shown. The readout gradients are nominal gradients $G_{nom}(t)$ and are rectangular in shape. In a third line of the pulse diagram, which is labelled as $G_{Diff}$, two diffusion gradient pulses $G_{Diff}$ are shown. The readout process takes place with the aid of the readout gradients $G_{Read}$ in a time interval between the times $t_1$ and $t_2$.

The gradients $G_{nom}$ shown in FIG. 6 are rectangular-shaped gradients. Rectangular or trapezoid-shaped gradients allow the determination of the gradient system transfer function GSTF for each rectangular- or trapezoid-shaped gradient. A rectangular- or trapezoid-shaped gradient may be corrected by applying an updated gradient system transfer function GSTF. A rectangular- or trapezoid-shaped gradient may itself serve as a test gradient because the derivation of an ideal rectangular gradient is a Dirac impulse (e.g., a delta-function). All the frequencies that are not included in the spectrum of rectangular- or trapezoid-shaped gradients cannot be used by the system due to slew rate limiting. In a partial diagram shown bottom left, the nominal input gradient $G_{nom}$ and also the actual output gradient $G_{real}$, as measured, are visualized. In each case, the amplitude A is recorded in mT/m over time t. A partial diagram 60c of FIG. 6, bottom right, shows the gradient system transfer function GSTF, which is calculated by dividing the output gradient $G_{real}$ by the input gradient $G_{nom}$. FIG. 6 shows the diagonal components $GSTF_{xx}$, $GSTF_{yy}$, $GSTF_{zz}$ of the gradient system transfer function GSTF or of the matrix thereof.

Figure 7:
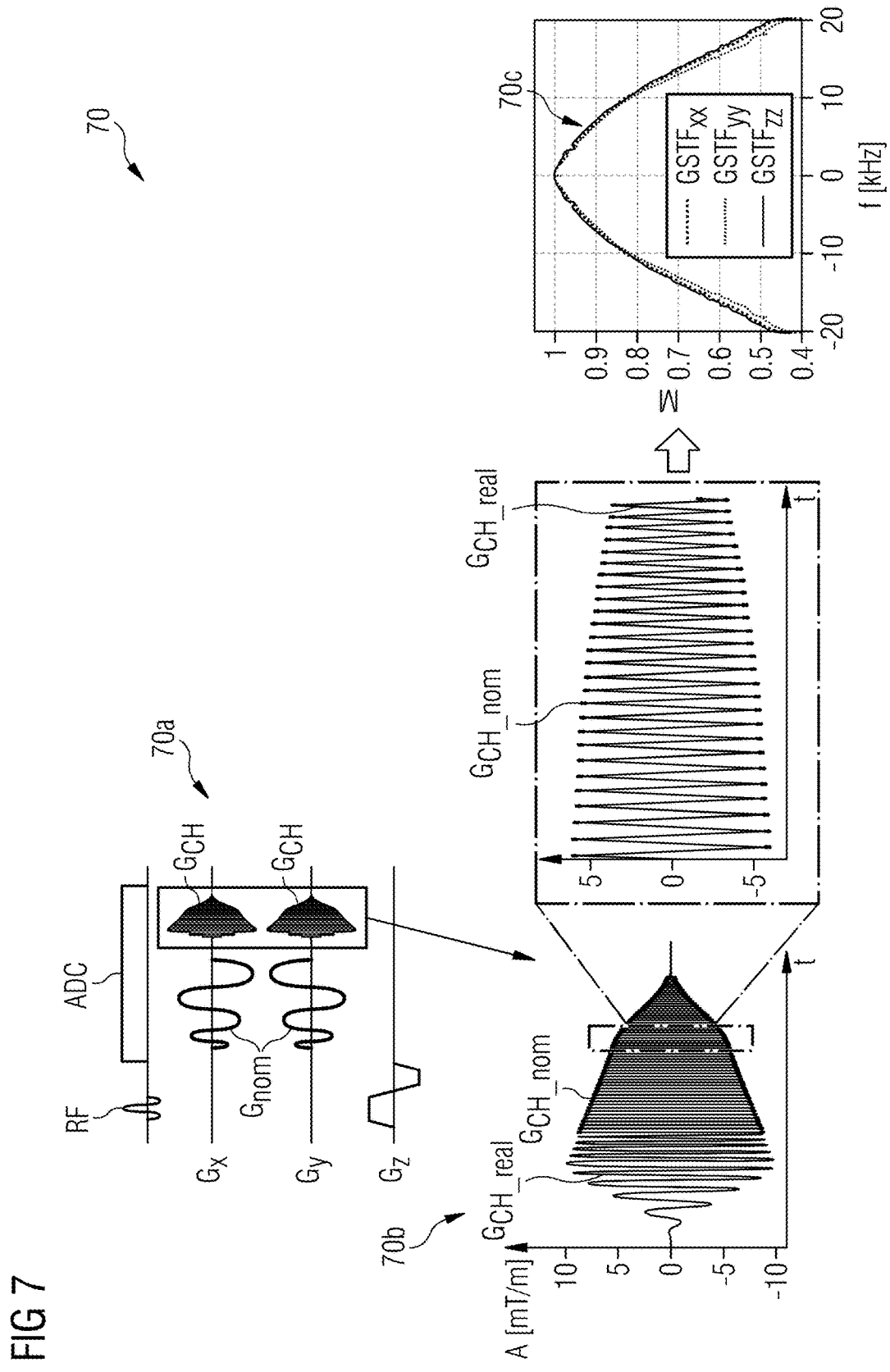
FIG. 7 is an exemplary pulse sequence diagram illustrating a gradient sequence with a spiral-shaped trajectory, a comparison of a nominal input gradient with the gradient that was actually output and measured, and also the respective GSTF function.

FIG. 7 shows a diagram 70 for a pulse sequence with a spiral-shaped trajectory of the readout gradients. As with diagram 60, shown in FIG. 6, the diagram shown is divided into three partial diagrams 70a, 70b, 70c.

A first partial diagram 70a shows a pulse sequence diagram illustrating a gradient sequence with a spiral-shaped trajectory for the gradients $G_x$, $G_y$ in the x-direction and in the y-direction. The spiral-shaped gradients are not suitable for calculating a gradient system-transfer function since the spiral-shaped gradients do not have a broad frequency range.

For this reason, in each repetition interval, an additional chirp gradient $G_{CH}$ is added to the respective spiral-shaped gradient. This chirp gradient $G_{CH}$ is shown in detail in a partial diagram 70b bottom left. The chirp gradient $G_{CH}$ includes a number of frequencies and is temporally short enough in order to fit into a repetition interval. The partial diagram 70b also shows a comparison of a nominal input gradient $G_{CH\_nom}$ in chirp form with the actual gradient $G_{CH\_real}$ that has been output and measured. For this purpose, a section of the chirp pulse illustrated is shown enlarged. The enlargement makes it clear that the amplitude of the nominal gradient $G_{CH\_nom}$ is somewhat greater and also that a time lag exists between the nominal gradient $G_{CH\_nom}$ and the real gradient $G_{CH\_real}$.

In a third partial diagram 70c, the respective GSTF function or the magnitude thereof M is shown as a function of the frequency. The gradient system transfer function GSTF is derived by dividing the output gradient $G_{CH\_real}$ by the input gradient $G_{Ch\_nom}$. The diagonal values of the gradient system transfer function GSTF or of the matrix thereof are shown.

In order to obtain test gradients with a broad frequency spectrum despite this in the event of a non-rectangular- or non-trapezoid-shaped gradient shape, a chirp pulse is therefore added to the gradients $G_x$, $G_y$. A chirp pulse is a short frequency-sweep over a sufficient frequency range. This pulse has the advantage that the pulse is very short and therefore fits into a repetition time without any problems. A combination of triangular-shaped gradients is not suitable because the triangular-shaped would increase the measurement time considerably, which would lead to a current gradient system status not being able to be corrected soon enough.

Figure 8:
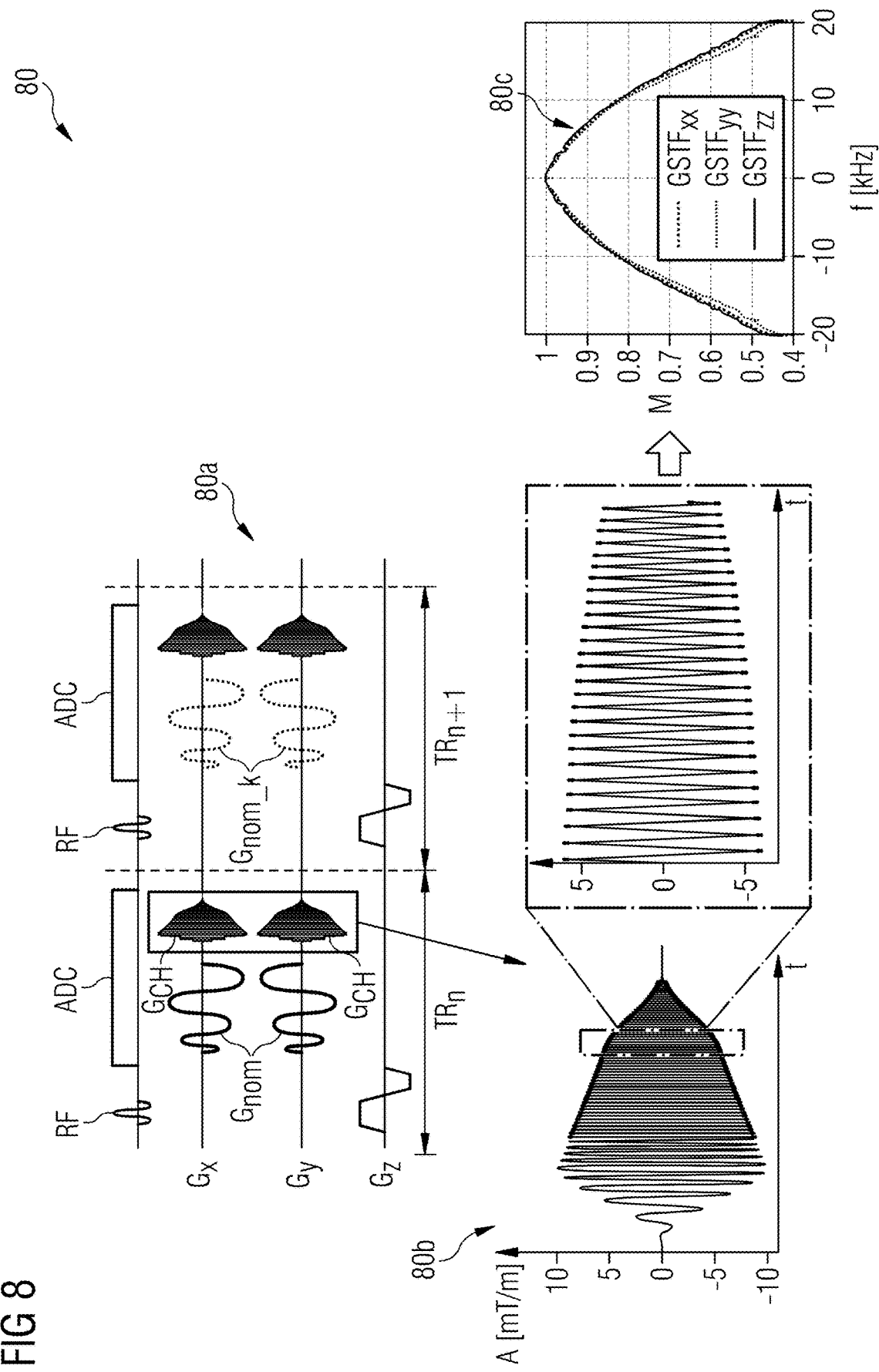
FIG. 8 is the pulse sequence diagram illustrated in FIG. 7 with two consecutive pulse sequence segments.

For both cases shown in FIG. 6 and FIG. 7, a retroactive correction, also known as a "post-correction", may be carried out. For this, the imaging gradients are acquired in the same repetition interval in which the imaging gradients are applied, and a gradient system transfer function GSTF is determined in order to correct the gradient trajectory during reconstruction. Alternatively, the gradient system transfer function GSTF may also be calculated in advance for the gradients in the next repetition time, a procedure that is also known as "pre-emphasis". The second of the two variants is shown in FIG. 8 for a spiral imaging sequence. The gradient system transfer function GSTF is determined by a repetition interval $TR_n$ and is used for correction in a subsequent repetition interval $TR_{n+1}$ (e.g., the changes in the gradient system with temperature are used within a repetition time to update or correct the gradient fields).

In a first partial diagram 80a, FIG. 8 shows the pulse sequence diagram already illustrated in FIG. 7 with two consecutive pulse sequence segments. A first repetition interval $TR_n$ provides the test input signal and the measured output signal in the form of a chirp sequence. Using this data, the gradient system transfer function GSTF is then calculated. Subsequently, in the next repetition interval $TR_{n+1}$, the corrected gradients $G_{nom\_k}$, which compensate for the changing gradient-System transfer function GSTF, are transmitted such that an image reconstruction may be carried out with the original gradient trajectory of the nominal gradients $G_{nom}$. The partial diagrams 80b and 80c in the lower part of FIG. 8 correspond with the partial diagrams already shown in FIG. 7, 70b, 70c.

Figure 9:
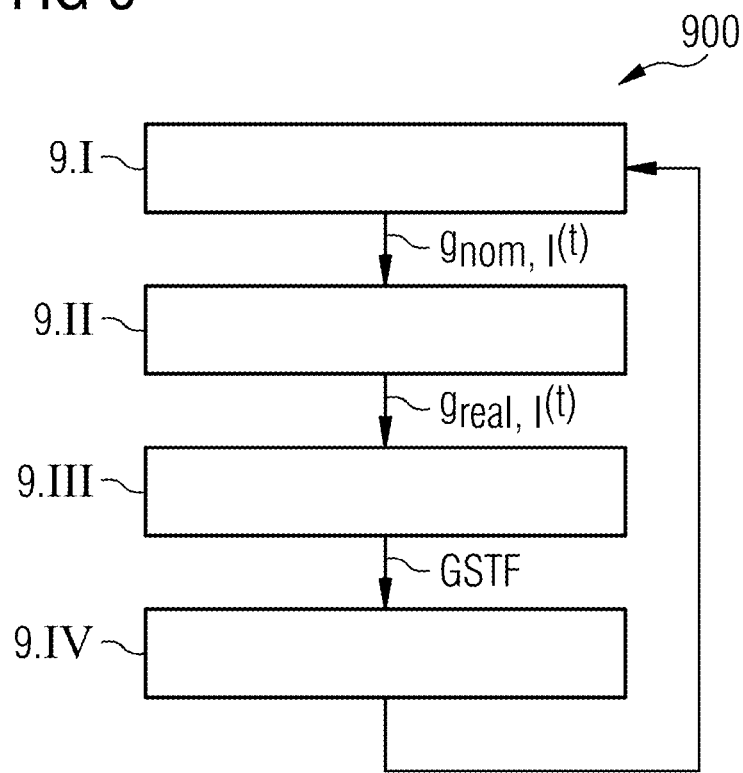
FIG. 9 is a flow diagram illustrating a correction method for reducing temperature-related deviations in a gradient response in an MR pulse sequence in MR imaging according to one embodiment.

FIG. 9 shows a flow diagram illustrating a correction method for reducing temperature-related deviations in a gradient response in an MR pulse sequence in MR imaging according to an exemplary embodiment.

In act 9.I, an MR pulse sequence is first applied (e.g., an EPI sequence), as shown in FIG. 6. The readout gradients of the gradient pulse sequence are embodied to be rectangular and are suitable as test gradients $g_{nom,i}(t)$ for determining a gradient response. In act 9.II, during the regular MR pulse sequence, a gradient response $g_{real,i}(t)$ to the nominal test gradient $g_{nom,i}(t)$ is now determined repeatedly by a magnetic field measurement in an examination region. Based on the gradient response $g_{real,i}(t)$ that has been determined, a gradient system transfer function GSTF is then calculated in act 9.III. The gradient system transfer function GSTF is derived from the quotient of the nominal test gradient $g_{nom,i}(t)$ and the gradient response. In act 9.IV, a corrected MR pulse sequence is finally determined based on the gradient system transfer function GSTF and the at least one nominal test gradient $g_{nom,i}(t)$. The calculation of the corrected MR pulse sequence ensues as shown in equations 1 or 2. The MR pulse sequence that has been determined may now be used in the context of an image reconstruction in order to use a correct trajectory in k-space for an image reconstruction. Acts 9.I to 9.IV are repeated again and again in order to therefore cover the temperature response during the entire acquisition process.

Figure 10:
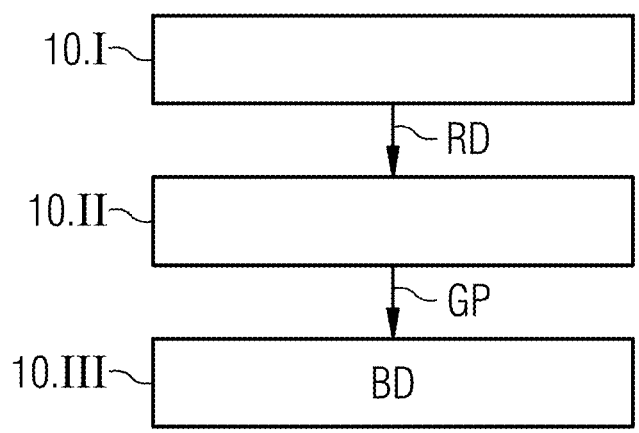
FIG. 10 is a flow diagram illustrating one embodiment of a method for recording magnetic resonance image data relating to an examination object.

FIG. 10 shows a flow diagram 100 that illustrates a method for recording magnetic resonance image data relating to an examination object. In act 10.I, raw data RD generated using a gradient pulse sequence is acquired. In act 10.II, a corrected gradient pulse sequence GP is determined using the correction method illustrated in FIG. 9 based on the gradient pulse sequence GP that has been applied and a determined response to the gradient pulse sequence that has been applied. A k-space-trajectory that has been determined based on this corrected gradient pulse sequence GP is used for the reconstruction of MR image data BD based on the raw data that has been acquired.

Figure 11:
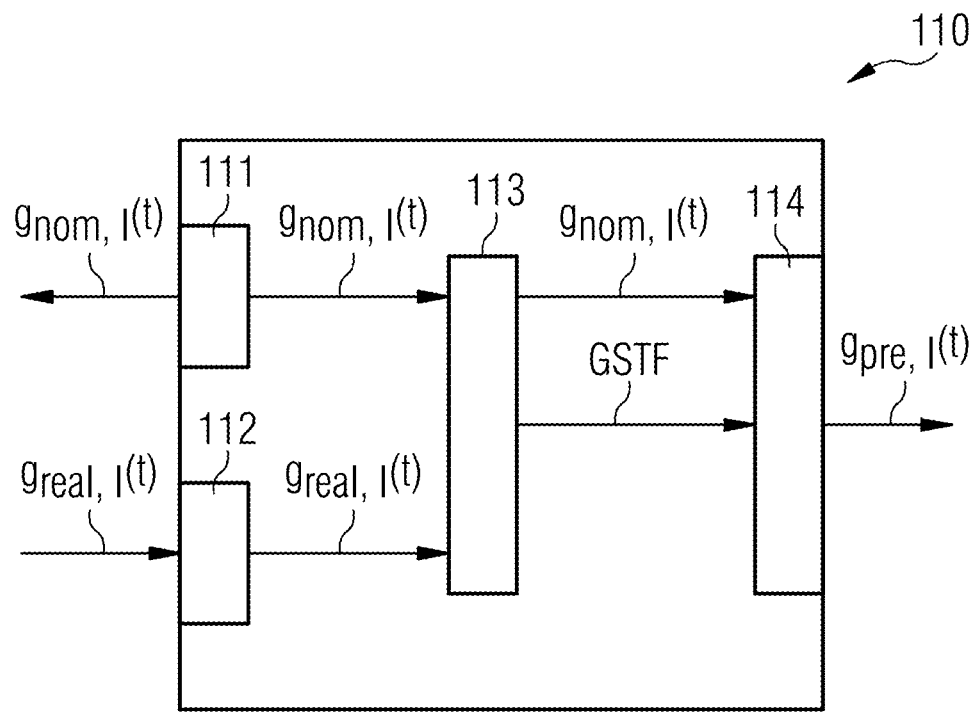
FIG. 11 is a block diagram illustrating a correction facility according to one embodiment.

FIG. 11 shows a block diagram that illustrates a correction facility 110 according to an exemplary embodiment. The correction facility 110 includes an output interface 111 for running an MR pulse sequence that includes at least one nominal test gradient $g_{nom,i}(t)$. Part of the correction facility 110 is also an input interface 112 for the repeated acquisition of a gradient response $g_{real,i}(t)$ to the at least one nominal test gradient $g_{nom,i}(t)$ using a magnetic field measurement in an examination region. The correction facility 110 also includes a determination unit 113 for determining a gradient system transfer function GSTF based on the gradient response $g_{real,i}(t)$. For this purpose, the determination unit 113 receives values of magnitude M and phase values P from the input interface 112 for a gradient response $g_{real,i}(t)$. The gradient system transfer function GSTF that has been determined is sent to a correction unit 114, which is likewise part of the correction facility 110. Based on the gradient system transfer function GSTF and the at least one nominal test gradient $g_{nom,i}(t)$ the correction unit 114 determines a corrected MR pulse sequence $g_{pre,i}(t)$. The correct MR pulse sequence $g_{pre,i}(t)$ may be forwarded to an image reconstruction unit, for example.

Figure 12:
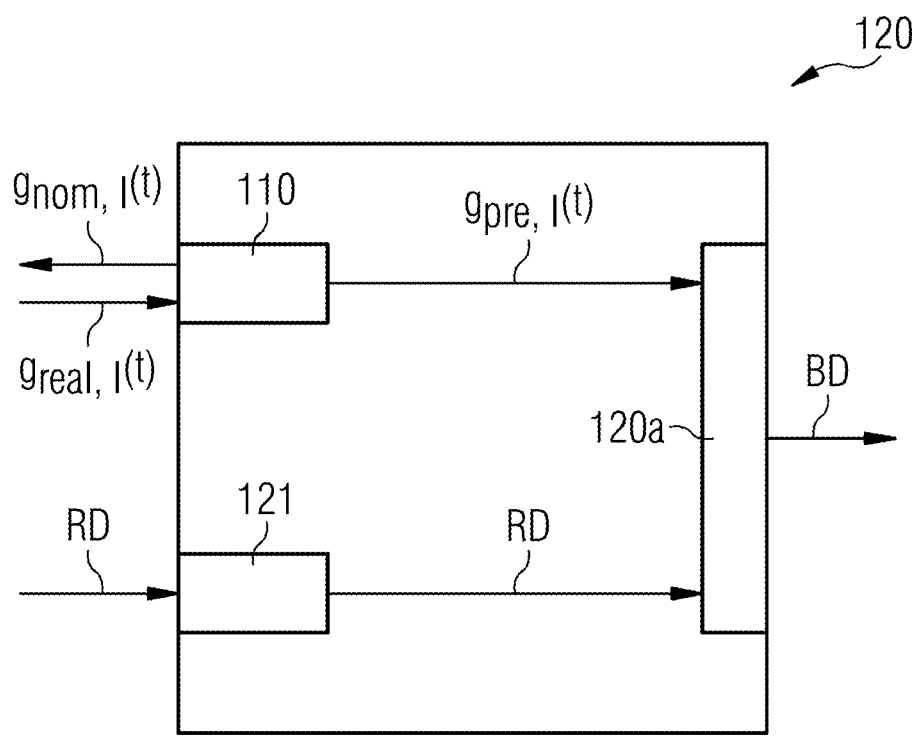
FIG. 12 is a block diagram illustrating one embodiment of an image reconstruction facility for reconstructing acquired raw data.

FIG. 12 shows, in schematic form, one embodiment of an image reconstruction facility 120 for reconstructing acquired raw data RD using an MR pulse sequence corrected by the correction facility 110 shown in FIG. 11. The image reconstruction facility 120 includes the correction facility 110 shown in FIG. 10 and also an input interface 121 for acquiring raw data RD for an MR imaging procedure. The raw data RD and the corrected gradient pulse sequence generated by the correction facility 110, together with the corrected gradient $g_{pre,i}(t)$ are transmitted to a reconstruction unit 120a that is likewise part of the image reconstruction facility 120.

Figure 13:
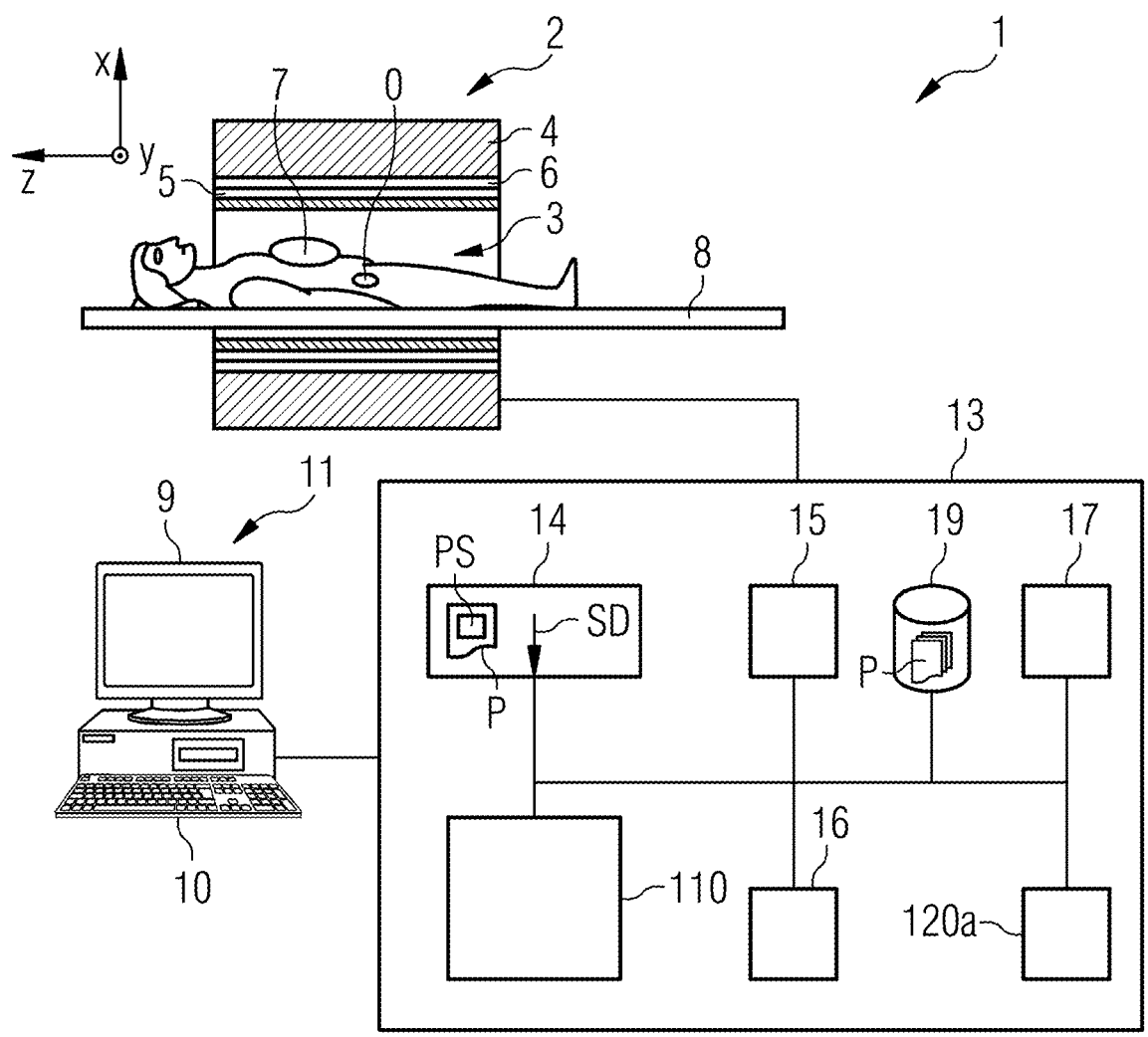
FIG. 13 is a schematic diagram illustrating an image reconstruction system according to one embodiment.

FIG. 13 shows a rough schematic diagram of one embodiment of a magnetic resonance tomography system 1. The magnetic resonance tomography system 1 includes the actual magnetic resonance scanner 2 with an examination space 3 or patient tunnel, in which a patient or test subject, in whose body the actual examination object O is located, is positioned on a couch 8. Even if, in the example shown, the examination object O is shown in the torso, the MR imaging procedure described is also often used for recording the brain since the MR imaging procedure is particularly well suited to imaging neurological structures.

The magnetic resonance scanner 2 is equipped in the usual manner with a main field magnet system 4, a gradient system 6, and also an RF transmission antenna system 5 and an RF receive antenna system 7. In the exemplary embodiment shown, the RF transmission antenna system 5 is a whole body coil fixedly incorporated in the magnetic resonance scanner 2, whereas the RF receive antenna system 7 consists of local coils to be arranged on the patient or test subject (symbolized in FIG. 13 only by an individual local coil). Basically, however, the whole body coil may also be used as an RF receive antenna system, and the local coils may also be used as an RF transmission antenna system, insofar as each of these coils are switchable into different operating modes. The main field magnet system 4 is embodied, for example, in the usual manner, such that the main field magnet system 4 generates a main magnetic field along the patient in the longitudinal direction (e.g., along the longitudinal axis that runs in the z-direction of the magnetic resonance scanner 2). In the usual manner, the gradient system 6 includes gradient coils that may be activated individually in order to be able to switch gradients independent of one another into the x, y or z direction. Moreover, the magnetic resonance scanner 2 (not shown) contains shim coils that may be embodied in the usual manner.

The magnetic resonance tomography system shown in FIG. 13 is a whole body installation with a patient tunnel into which a patient may be fully inserted. However, the present embodiments may basically also be used on other magnetic resonance tomography systems (e.g., with a C-shaped housing that is open at the sides). Corresponding recordings of the examination object O are to be produced.

The magnetic resonance tomography system 1 further includes a central control facility 13 that is used to control the MR system 1. This central control facility 13 includes a sequence control unit 14. This controls the sequence of radiofrequency (RF) pulses and of gradient pulses as a function of a selected pulse sequence PS or of a succession of a plurality of pulse sequences for recording a plurality of slices in an interesting volume region of the examination object within a measurement session. Such a pulse sequence PS may be set and parameterized within a measurement or control protocol P, for example. Various control protocols P for different measurements or measurement sessions are usually stored in a memory 19 and may be selected by an operator (and optionally changed where necessary) and are then used to perform the measurement. In the present case, the control facility 13 contains pulse sequences for acquiring the raw data.

To output the individual RF pulses in a pulse sequence PS, the central control facility 13 has a radiofrequency transmission facility 15 that generates the RF pulses, amplifies the RF pulses, and feeds the RF pulses via an appropriate interface (not shown in detail) into the RF transmission antenna system 5. To control the gradient coils in the gradient system 6 in order to switch the gradient pulses appropriately according to the set pulse sequence PS, the control facility 13 has a gradient system interface 16. The diffusion gradient pulses and also, for example, spoiler gradient pulses may be applied via this gradient system interface 16. The sequence control unit 14 communicates in an appropriate manner, for example, by transmitting sequence control data SD, with the radiofrequency transmission facility 15 and the gradient system interface 16 to carry out the pulse sequence PS.

In addition, the control facility 13 has a radiofrequency receive facility 17 (likewise communicating in an appropriate manner with the sequence control unit 14) in order to receive magnetic resonance signals in a coordinated manner and therefore to acquire the raw data using the RF receive antenna system 7 within the readout windows ADC set in the pulse sequence PS.

For example, a reconstruction unit 120a receives the acquired raw data and reconstructs magnetic resonance image data therefrom. This reconstruction may likewise ensue based on parameters that may be set in the respective measurement or control protocol P. This image data may then be stored, for example, in a memory 19.

It is basically known in detail to a person skilled in the art how suitable raw data may be acquired, and MR images or parameter maps may be reconstructed therefrom by irradiating RF pulses and switching on gradient pulses; therefore, this is not explained in further detail here.

The correction facility 110 is in data contact with the other units (e.g., with the gradient system interface 16 or the sequence control unit 14). Alternatively, the correction facility 110 may also be part of the sequence control unit 14. The correction facility 110 includes a plurality of units for determining or acquiring various parameters. First, appropriate test and reference pulse sequences $g_{nom,i}(t)$ are generated by the correction facility 110 and transmitted to the gradient system interface 16 and to the sequence control unit 14. Second, corrected gradients $g_{pre,i}(t)$ are generated by the correction facility 110 based on a determined gradient characterization function GSTF and are transmitted by the correction facility 110 to the reconstruction unit 120a, which carries out an image reconstruction on the basis thereof and on the basis of raw data.

The central control facility 13 may be operated via a terminal 11 with an input unit 10 and a display unit 9, through which the entire magnetic resonance tomography system 1 may also be operated by an operator. The display unit 9 may also be used to display magnetic resonance tomography images, and using the input unit 10, optionally in combination with the display unit 9, measurements may be planned and started and, for example, control protocols P may be selected and optionally modified.

The magnetic resonance tomography system 1 according to the present embodiments and, for example, the control facility 13 may in addition include a number of further components that are not shown here individually but are usually present in installations of this kind, such as, for example, a network interface to connect the entire system with a network and in order to be able to exchange raw data and/or image data or parameter maps and also further data, such as patient-relevant data, for example, or control protocols.

It is basically known to a person skilled in the art how suitable raw data may be acquired and magnetic resonance tomography images may be reconstructed therefrom by irradiating RF pulses and generating gradient fields, and this is therefore not explained in further detail here. Likewise, a very wide range of measurement sequences, such as, for example, EPI measurement sequences or other measurement sequences for generating image data, and also diffusion-weighted image data are basically known to a person skilled in the art.

The methods and structures described in detail in the aforementioned are exemplary embodiments, and the basic principle may also be varied in many ways by a person skilled in the art without departing from the scope of the invention insofar as set out in the claims. Further, the method described is likewise not restricted to medical applications. For the sake of completeness, the use of the indefinite article "a" or "an" does not preclude the relevant features from also being present in plurality. Likewise, the term "unit" does not preclude this from consisting of a plurality of components that may optionally also be spatially distributed.

The elements and features recited in the appended claims may be combined in different ways to produce new claims that likewise fall within the scope of the present invention. Thus, whereas the dependent claims appended below depend from only a single independent or dependent claim, it is to be understood that these dependent claims may, alternatively, be made to depend in the alternative from any preceding or following claim, whether independent or dependent. Such new combinations are to be understood as forming a part of the present specification.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A correction method for reducing temperature-related deviations in a gradient response of a magnetic resonance (MR) pulse sequence in MR imaging, the correction method comprising:
    applying an MR pulse sequence that includes at least one nominal test gradient, wherein the MR pulse sequence includes the at least one nominal test gradient as an additional gradient pulse;
    repeatedly acquiring a gradient response to the at least one nominal test gradient using a magnetic field measurement in an examination region during an MR imaging process;
    determining a gradient characterization function based on the gradient response; and
    determining a corrected MR pulse sequence based on the gradient characterization function and the at least one nominal test gradient.

2. The correction method of claim 1, wherein repeatedly acquiring the gradient response comprises acquiring the gradient response at least after every fifth repetition interval.

3. The correction method of claim 2, wherein the repeatedly acquiring the gradient response comprises acquiring the gradient response in each repetition interval.

4. The correction method of claim 1, wherein the at least one nominal test gradient has a shape of a rectangle or a trapezium.

5. The correction method of claim 4, wherein the MR pulse sequence includes the at least one nominal test gradient as an integral component.

6. The correction method of claim 1, wherein the MR pulse sequence does not include any rectangular- or trapezoid-shaped gradient pulses, such that the at least one nominal test gradient has a shape that differs from a rectangle or a trapezium.

7. The correction method of claim 6, wherein the at least one nominal test gradient comprises at least one chirp pulse, and
wherein determining the gradient characterization function comprises acquiring a gradient response of the at least one chirp pulse.

8. The correction method of claim 1, wherein the MR pulse sequence includes at least one spiral-shaped gradient.

9. The correction method of claim 1, wherein based on the gradient characterization function and the at least one nominal test gradient in a repetition interval, a gradient in the MR pulse sequence that has already been applied is corrected.

10. The correction method of claim 1, wherein based on the gradient system transfer function and the at least one nominal test gradient of a repetition interval, a corrected gradient in the MR pulse sequence of a subsequent repetition interval is determined.

11. A method for recording magnetic resonance image data relating to an examination object, the method comprising:
   acquiring raw data that is generated by a gradient pulse sequence;
   determining a corrected gradient pulse sequence, the determining of the corrected gradient pulse sequence comprising:
      applying the gradient pulse sequence, which includes at least one nominal test gradient as an additional gradient pulse;
      repeatedly acquiring a gradient response to the at least one nominal test gradient using a magnetic field measurement in an examination region during an MR imaging process;
      determining a gradient characterization function based on the gradient response; and
      determining the corrected gradient pulse sequence based on the gradient characterization function and the at least one nominal test gradient; and
   reconstructing magnetic resonance (MR) image data based on the acquired raw data and the corrected gradient pulse sequence.

12. A correction facility comprising:
   an output interface configured to run a magnetic resonance (MR) pulse sequence that includes at least one nominal test gradient, wherein the MR pulse sequence includes the at least one nominal test gradient as an additional gradient pulse;
   an input interface configured to repeatedly acquire a gradient response to the at least one nominal test gradient using a magnetic field measurement in an examination region;
   a determination unit configured to determine a gradient characterization function based on the gradient response; and
   a correction unit configured to determine a corrected MR pulse sequence based on the gradient characterization function and the at least one nominal test gradient.

13. A magnetic resonance (MR) image reconstruction facility comprising:
   a correction facility comprising:
      an output interface configured to run a magnetic resonance (MR) pulse sequence that includes at least one nominal test gradient as an additional gradient pulse;
      a first input interface configured to repeatedly acquire a gradient response to the at least one nominal test gradient using a magnetic field measurement in an examination region;
      a determination unit configured to determine a gradient characterization function based on the gradient response; and
      a correction unit configured to determine a corrected MR pulse sequence based on the gradient characterization function and the at least one nominal test gradient
   a second input interface configured to acquire MR raw data from the examination region; and
   an image reconstruction unit configured to reconstruct image data based on the acquired MR raw data and the corrected MR pulse sequence.

14. A magnetic resonance installation comprising:
   a main field magnet system;
   a radio frequency (RF) transmission antenna system;
   a gradient system;
   an RF receive antenna system comprising a control facility for activating the main field magnet system, the RF transmission antenna system, the gradient system, and the RF receive antenna system; and
   a correction facility comprising:
      an output interface configured to run a magnetic resonance (MR) pulse sequence that includes at least one nominal test gradient as an additional gradient pulse;
      an input interface configured to repeatedly acquire a gradient response to the at least one nominal test gradient using a magnetic field measurement in an examination region;
      a determination unit configured to determine a gradient characterization function based on the gradient response; and
      a correction unit configured to determine a corrected MR pulse sequence based on the gradient characterization function and the at least one nominal test gradient.

15. In a non-transitory computer-readable storage medium that stores instructions executable by a computation unit to reduce temperature-related deviations in a gradient response of a magnetic resonance (MR) pulse sequence in MR imaging, the instructions comprising:
   applying an MR pulse sequence that includes at least one nominal test gradient, wherein the MR pulse sequence includes the at least one nominal test gradient as an additional gradient pulse;
   repeatedly acquiring a gradient response to the at least one nominal test gradient using a magnetic field measurement in an examination region during an MR imaging process;
   determining a gradient characterization function based on the gradient response; and
   determining a corrected MR pulse sequence based on the gradient characterization function and the at least one nominal test gradient.

* * * * *